(12) United States Patent
Geuppert et al.

(10) Patent No.: US 9,410,662 B2
(45) Date of Patent: Aug. 9, 2016

(54) ARRANGEMENT FOR MOUNTING AN OPTICAL ELEMENT, IN PARTICULAR IN AN EUV PROJECTION EXPOSURE APPARATUS

(71) Applicant: Carl Zeiss SMT GmbH, Oberkochen (DE)

(72) Inventors: Bernhard Geuppert, Aalen (DE); Rodolfo Rabe, Aalen-Himmlingen (DE); Ulrich Schoenhoff, Neu-Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 271 days.

(21) Appl. No.: 13/940,790

(22) Filed: Jul. 12, 2013

(65) Prior Publication Data

US 2013/0314771 A1 Nov. 28, 2013

Related U.S. Application Data

(60) Provisional application No. 61/443,843, filed on Feb. 17, 2011, provisional application No. 61/536,655, filed on Sep. 20, 2011.

(30) Foreign Application Priority Data

Feb. 17, 2011 (DE) .......................... 10 2011 004 299
Sep. 20, 2011 (DE) .......................... 10 2011 082 994

(51) Int. Cl.
*G02B 26/08* (2006.01)
*G02B 26/10* (2006.01)
(Continued)

(52) U.S. Cl.
CPC ............. *F16M 13/022* (2013.01); *G02B 7/005* (2013.01); *G02B 7/182* (2013.01); *G03F 7/709* (2013.01); *G03F 7/70825* (2013.01)

(58) Field of Classification Search
CPC ........ G02B 7/18; G02B 7/182; G02B 7/1821; G02B 7/1822; G02B 6/3564; G02B 6/3568; G02B 6/3574; G02B 7/005; F16M 13/022; G03F 7/0825; G03F 7/709
USPC .......... 359/198.1, 199.1, 200.1, 221.2, 221.3, 359/225.1, 226.1, 226.2, 350
See application file for complete search history.

(56) References Cited

U.S. PATENT DOCUMENTS 5,160,112 A * 11/1992 Pritchard et al. .............. 248/604
5,402,258 A * 3/1995 Murakami et al. ......... 359/205.1
(Continued)

FOREIGN PATENT DOCUMENTS

DE 19951176 A1 4/2001
DE 102008041310 3/2009
(Continued)

OTHER PUBLICATIONS

International Search Report and Written Opinion for corresponding PCT Appl No. PCT/EP2012/052259, dated May 24, 2012.
(Continued)

*Primary Examiner* — Bumsuk Won
*Assistant Examiner* — Collin X Beatty
(74) *Attorney, Agent, or Firm* — Fish & Richardson P.C.

(57) ABSTRACT

The invention relates to an arrangement for mounting an optical element, in particular in an EUV projection exposure apparatus, comprising at least one actuator which exerts a controllable force on the optical element; wherein between the actuator and the optical element a mechanical coupling in the form of a pin is embodied in such a way that, relative to the drive axis of the actuator, the ratio of the stiffness of the mechanical coupling in an axial direction to the stiffness in a lateral direction is at least 100; and at least one damping element which brings about a damping of a natural vibration form of the pin in a lateral direction.

25 Claims, 10 Drawing Sheets

(51) Int. Cl.
  *G02B 26/12* (2006.01)
  *G06K 7/10* (2006.01)
  *F16M 13/02* (2006.01)
  *G02B 7/00* (2006.01)
  *G03F 7/20* (2006.01)
  *G02B 7/182* (2006.01)

(56) References Cited

U.S. PATENT DOCUMENTS

| | | | |
|---|---|---|---|
| 6,457,866 | B1 | 10/2002 | Scheibl |
| 2005/0035684 | A1 | 2/2005 | Fuse et al. |
| 2008/0136267 | A1* | 6/2008 | Laabs et al. ............ 310/12 |
| 2008/0278828 | A1 | 11/2008 | Rau et al. |
| 2009/0213445 | A1* | 8/2009 | Kabeya ............ 359/198.1 |
| 2012/0138401 | A1 | 6/2012 | Vogler et al. |

FOREIGN PATENT DOCUMENTS

| | | |
|---|---|---|
| DE | 102009008965 | 9/2009 |
| DE | 102009005954 | 7/2010 |
| EP | 1962124 A1 | 8/2008 |
| GB | 2 183 361 | 6/1987 |
| JP | H 03-242613 A | 10/1991 |
| JP | 2007-245643 | 9/2007 |
| WO | WO 2005/026801 | 3/2005 |
| WO | WO 2007/006577 | 1/2007 |

OTHER PUBLICATIONS

German Office Action, and translation thereof, for corresponding DE Appl No. 10 2011 004 299.7, dated Nov. 18, 2011.
The International Preliminary Report on Patentability for corresponding PCT Appl No. PCT/EP2012/052259, dated Aug. 21, 2013.
Japanese Office Action, with translation thereof, for corresponding JP Appl No. 2013-553879, dated Jan. 27, 2016.

* cited by examiner

ARRANGEMENT FOR MOUNTING AN OPTICAL ELEMENT, IN PARTICULAR IN AN EUV PROJECTION EXPOSURE APPARATUS

CROSS REFERENCE TO RELATED APPLICATIONS

The present application is a continuation of, and claims benefit under 35 USC 120 to, international application PCT/EP2012/052259, filed Feb. 10, 2012, which claims benefit under 35 USC 119 of German Patent Application DE 10 2011 004 299.7 and also claims priority under 35 USC 119(e) to U.S. 61/443,843, both filed on Feb. 17, 2011, and of German Patent Application DE 10 2011 082 994.6 and U.S. 61/536, 655, both filed Sep. 20, 2011. The content of these applications is hereby incorporated by reference.

BACKGROUND OF THE INVENTION

1. Field of the Invention

The invention relates to an arrangement for mounting an optical element, in particular in an EUV projection exposure apparatus.

2. Prior Art

Microlithography is used for producing microstructured components such as, for example, integrated circuits or LCDs. The microlithography process is carried out in a so-called projection exposure apparatus comprising an illumination device and a projection lens. The image of a mask (=reticle) illuminated by means of the illumination device is in this case projected by means of the projection lens onto a substrate (e.g. a silicon wafer) coated with a light-sensitive layer (photoresist) and arranged in the image plane of the projection lens, in order to transfer the mask structure to the light-sensitive coating of the substrate.

In a projection exposure apparatus designed for EUV (i.e. for electromagnetic radiation having a wavelength of less than 15 nm), owing to the lack of availability of light-transmissive materials, mirrors are used as optical components for the imaging process. Said mirrors can e.g. be fixed on a carrier frame and designed to be at least partly manipulatable in order to enable a movement of the respective mirror in six degrees of freedom (i.e. with regard to displacements in the three spatial directions x, y and z and also with regard to rotations $R_x$, $R_y$ and $R_z$ about the corresponding axes). It is thereby possible to compensate, for instance, for changes in the optical properties which occur during the operation of the projection exposure apparatus e.g. on account of thermal influences.

WO 2005/026801 A2 discloses, inter alia, using in a projection lens of an EUV projection exposure apparatus for the manipulation of optical elements such as mirrors in up to six degrees of freedom three actuator devices each having at least two Lorentz actuators or two actively driveable movement spindles by means of which the respective optical element or the relevant mirror can be moved relative to the housing of the projection lens.

US 2008/0278828 A1 discloses, inter alia, fitting to an optical element in a projection exposure apparatus at least one additional element which brings about an energy dissipation of the vibration energy of the optical element by means of friction.

In order to transmit the drive force of an actuator to an optical element, rod-shaped components or pins are used, in particular, which can be effected for example in a known hexapod arrangement (see FIG. 7), in which each of a total of six pins or rods 10-60 has ball joints in its end sections in order to enable a decoupling of undesirable parasitic forces and moments during the actuation of the optical element (e.g. of a mirror M).

Figure 7:
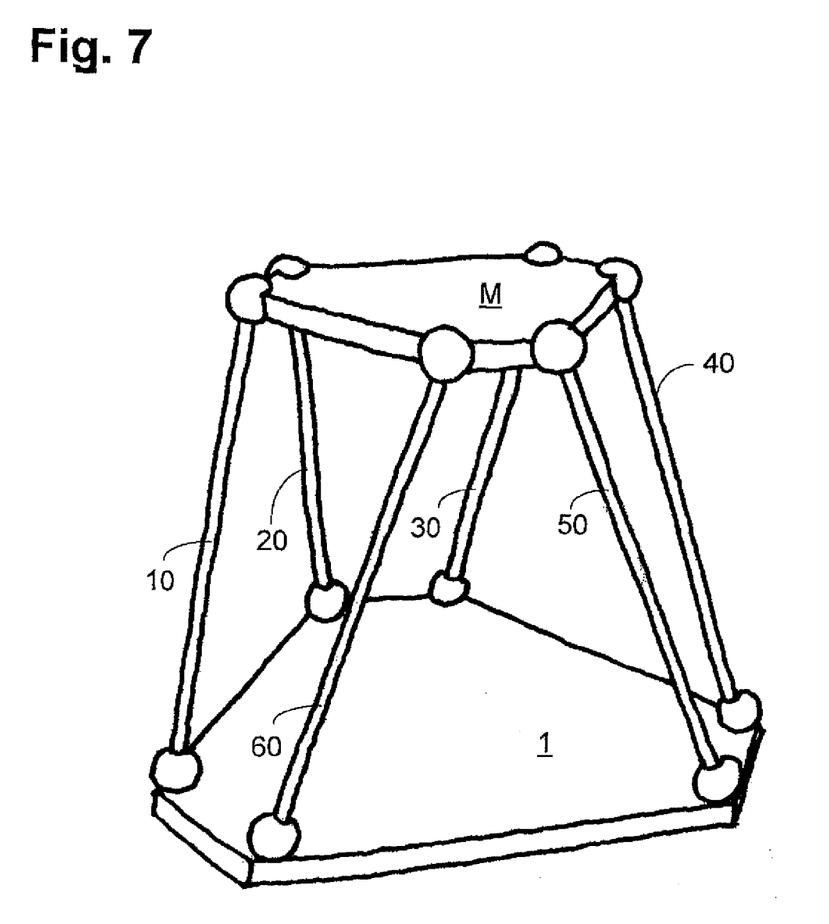
FIG. 7 shows a schematic illustration of a known hexapod construction for elucidating one possible application of the invention.

Between the baseplate 1 and the respective pins or rods, it is possible to provide an actuator for exerting a controllable force on the optical element or the mirror M. In the case of the small actuating distances (e.g. in the single-digit millimeter range), typically required in lithography applications, the use of solid-state joints in the form of universal joints has proved to be worthwhile for realizing the function of such ball joints, since such solid-state joints substantially exhibit a behaviour that is free of friction, without play and without hysteresis. Within the meaning of the present application, a universal joint should be understood to mean a joint which has two tilting joints having orthogonal orientation of the tilting axes with respect to one another (or tilting joints connected in series relative to the force flow), wherein said universal joints can have, in particular, a common pivot point.

In particular, a rod-shaped component or pin, for example in the arrangement from FIG. 7 (but not restricted thereto), can have two universal joints in its respective end sections for the purpose of decoupling in a lateral direction (i.e. perpendicular to the drive axis), such that the pin or rod has a high stiffness only in an axial direction for transmitting a force or movement, whereas only a low stiffness or a decoupling is present in all other directions.

Figure 8:
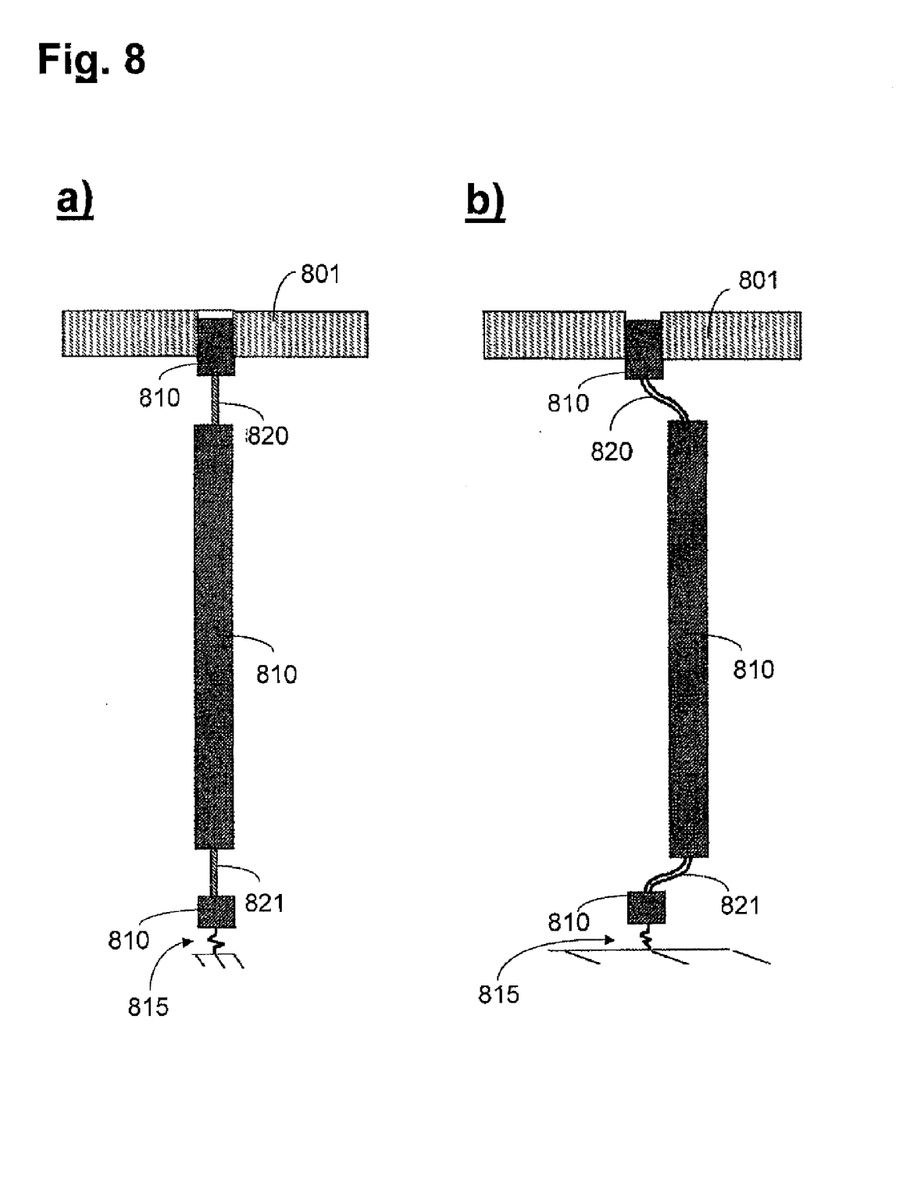
FIGS. 8a-c show schematic illustrations for elucidating a problem addressed by the present invention.

FIG. 8 shows such a pin or rod 810 in a merely schematic illustration, wherein, of the universal joints 820, 821, only an individual joint in the form of a leaf spring is depicted in each case for the purpose of simplification, and wherein "801" designates a platform which carries an optical element such as e.g. a mirror and which is actuated by means of an actuator (not illustrated). In FIG. 8a-c, the stiffness of the linking of the pin 810 to the "fixed world" in each case by means of a spring is illustrated and designated by "815".

What can be achieved given a suitable design of the pin 810 is that above the first axial natural frequency of the system composed of pin and actuator mass, disturbing natural frequencies of the mirror are filtered or suppressed. If a specific natural frequency in an axial direction is present, then excitations whose frequency exceeds this value of the natural frequency are coupled into the mirror in attenuated fashion in a manner dependent on the square of the quotient of this value of the natural frequency and the excitation frequency, since the system composed of actuator mass and pin brings about a corresponding $2^{nd}$ order low-pass filtering. Even if this resonance is accompanied by an amplitude magnification, it is possible to obtain a stabilization in the control loop given a suitable design of the tuning parameters or choice of the suitable phase.

In this case, however, during operation the further problem can occur that undesirable transverse resonances, such as are indicated merely schematically in FIG. 8b and FIG. 8c, typically have significantly lower natural frequencies which, in the above numerical example, can typically be of the order of magnitude of 400 Hz. These transverse resonances are likewise accompanied by an amplitude magnification, wherein now, on account of the circumstance that the available or originally free tuning parameters have already been defined for taking account of the desired axial resonance described above, it is no longer possible under certain circumstances to prevent the control loop from becoming unstable.

SUMMARY OF THE INVENTION

It is an object of the present invention to provide a mount for mounting an optical element, in particular in an EUV projection exposure apparatus, which enables the positioning of the optical element to be controlled stably or in a manner as free from disturbing influences as possible.

An arrangement according to the invention for mounting an optical element, in particular in an EUV projection exposure apparatus, comprises:
- at least one actuator which exerts a controllable force on the optical element;
- wherein between the actuator and the optical element a mechanical coupling in the form of a pin is embodied in such a way that, relative to the drive axis of the actuator, the ratio of the stiffness of said mechanical coupling in an axial direction to the stiffness in a lateral direction is at least 100; and
- at least one damping element which brings about a damping of a natural vibration form of the pin in a lateral direction.

"Stiffness in a lateral direction" should be understood to mean the ratio of transverse force to transverse deflection at the location of the actuator, wherein the "transverse force" denotes the force component perpendicular to the drive axis of the pin (=rod).

In this case, the invention proceeds from the linking of an optical element to an actuator by means of a pin having a high stiffness only in an axial direction for the transmission of a force or movement along the drive direction of an actuator, whereas only a low stiffness (i.e. a decoupling) is present in all other directions.

The invention is based on the concept, in particular, with regard to the undesirable transverse resonances described in the introduction, of indeed still permitting—relative to the axial vibration behaviour—comparatively low natural frequencies for the lateral vibration behaviour, but preventing, by way of damping, the resonance magnification associated with the transverse resonance from being manifested in the transmission function. In other words, although during the operation of the arrangement according to the invention the—inherently undesirable—low natural frequencies in a lateral direction still occur, an amplitude magnification is no longer effected on account of the damping for said transverse resonances.

In this case, the damping according to the invention is realized such that the movement of the optical element (e.g. the adjustment or movement of a mirror) which is to be realized by means of the actuator is not impeded. Furthermore, the damping according to the invention is preferably realized such that although the transverse resonances described above are damped, the desired axial resonance described in the introduction is not damped. According to the invention, therefore, the axial natural vibration behaviour is intended to be maintained. That is based on the consideration that the desired effect of the pin as low-pass filter or vibration isolator, said effect being achieved by means of the axial resonance and likewise being described in the introduction, is all the more effective, the less the axial vibration behaviour of the relevant pin is damped, whereas this filter effect becomes all the worse with greater axial damping.

In accordance with one embodiment, the damping element has a Lehr's damping factor which is at least 1% of the critical damping (i.e. the damping in the case of an aperiodic limit case, see formula (2) below) for said transverse natural vibration form.

In accordance with one embodiment, the damping element is produced from a material belonging to the group containing rubbers, e.g. fluoro rubbers (FKM), fluorinated elastomers or perfluoro rubbers (FFKM).

The above materials are suitable, for example, for use in the application of microlithography as envisaged in particular in the present case. In further embodiments, it is also possible to employ other damping rubber materials (in other applications, under certain circumstances, for example also fluorinated silicone rubber or tetrafluoroethylene/propylene rubber (FEPM)).

In accordance with one embodiment, the damping element is arranged in such a way that it leaves a natural vibration form of the pin in an axial direction at least substantially undamped. In this case, Lehr's damping factor in an axial direction is preferably not more than 1%.

In accordance with one embodiment, the damping element is arranged on an outer surface of the pin and preferably surrounds the pin in a collar- or ring-shaped fashion.

In accordance with one embodiment, the damping element is arranged between the outer surface of the pin and a further component, in particular a sleeve surrounding the pin.

In accordance with one embodiment, the damping element is arranged in such a way that it is supported on the actuator. The damping element can be arranged between the actuator and a stationary structure, in particular an actuator housing.

This configuration is advantageous in so far as it takes account of the circumstance that the damping element, in addition to the desired damping effect, in principle, always also has a certain stiffness which is inherently undesirable in the arrangement. The support of the damping element on the actuator or the arrangement of the damping element between the actuator and a stationary structure, in particular the actuator housing, can now prevent the additional stiffness associated with the damping element from being introduced, for instance, into (universal) joints present on the pin, from where it can in turn be transmitted to the optical element and bring about undesirable deformations there and/or can necessitate the application of additional (positioning) forces by other actuators.

If it is then further taken into consideration that a deflection of the optical element or mirror can also be accompanied by lateral movements of the pin, since the guidance of the pin in the lateral direction is not infinitely stiff, the support of the damping element on the actuator or the arrangement of the damping element between the actuator and a stationary structure, in particular the actuator housing, can result in a damping of these lateral movements of the pin—relative to the drive axis of the actuator—by the damping element.

In other words, the above-described embodiment follows, in addition to the previously explained basic principle of the invention, the further concept of arranging the damping element in such a way that firstly the stiffness unavoidably associated with the damping element is introduced in such a way or at such a location that said stiffness exerts no disturbing influence (for instance in the form of deformations of the optical element) on the performance of the arrangement, and secondly a damping of lateral movements of the pin is obtained.

In accordance with one embodiment, the damping element is configured in such a way that it forms a guide for the actuator in an axial direction relative to the drive axis of the actuator. In this way it is possible, if appropriate, to dispense, in particular, with guide elements—arranged typically for the purpose of the linear guidance of the actuator along its drive direction—such as are configured e.g. in the form of a double spring system composed of leaf springs, since the function of such guide elements, on the one hand, and the damping effect of the damping element according to the invention, on the other hand, can be combined as it were in one component, namely the damping element according to the invention. In this case, the damping effect can be achieved by means of the suitable material (in particular the rubber materials used, for example, according to the invention for the damping element), whereas the guide effect is achieved by virtue of the fact that the suitable geometry of the damping element results in a comparatively high compliance in an axial direction relative to the drive axis of the actuator and a comparatively high stiffness in a lateral direction relative to the drive axis of the actuator. As a result, a simplification of the construction of the arrangement according to the invention can thus be achieved on account of the explained double function of the damping element and dispensing with additional guide elements.

In accordance with one embodiment, by means of which, in particular, the above concept can be realized, the damping element has a structure which increases the stiffness in a lateral direction. Said structure can have, in particular, a bead or a grooved depression or elevation. The criterion according to which the structure which increases the stiffness in a lateral direction has a bead is intended to be considered, in particular, also to encompass configurations in which the damping element has a ring-shaped geometry with a U-profile, that is to say in which the damping element as it were itself constitutes the bead.

In accordance with one embodiment, the damping element is embodied in the form of a membrane.

In accordance with one embodiment, the pin has at least two universal joints.

In accordance with one embodiment, the damping element is arranged at a distance from one of said universal joints which is less than 5%, in particular less than 1%, of the total length of the pin.

Furthermore, the damping element is preferably arranged such that the contribution of the damping element to the torsional stiffness is not more than 50%, more particularly not more than 30%, more particularly not more than 10%, of the torsional stiffness of the universal joints in the pin.

In accordance with one embodiment, at least one of the universal joints has a cutout, in which the damping element is arranged. Said cutout can be, in particular, a through-hole extending through the universal joint.

The invention furthermore relates to an EUV projection exposure apparatus comprising an arrangement according to the invention.

Further configurations of the invention can be gathered from the description and the dependent claims.

The invention is explained in greater detail below on the basis of exemplary embodiments illustrated in the accompanying drawings.

DETAILED DESCRIPTION OF PREFERRED EMBODIMENTS

Figure 1:
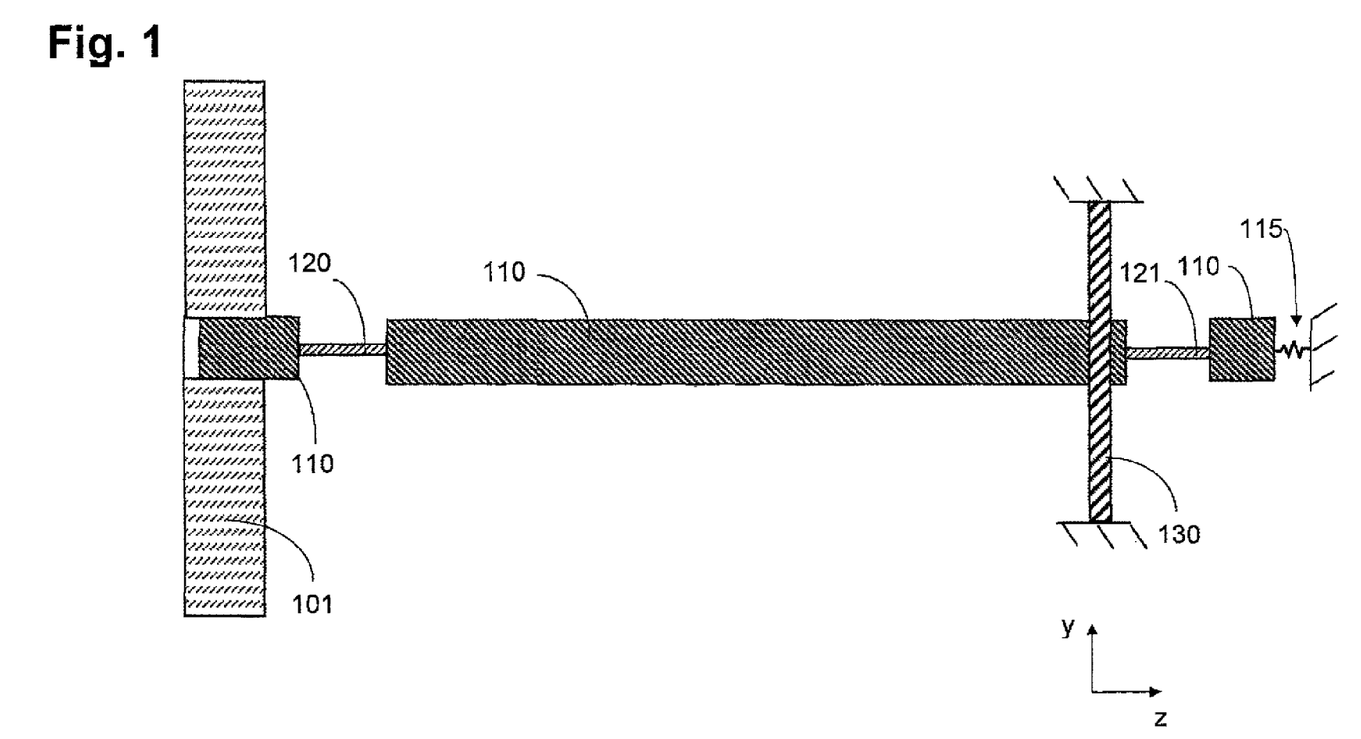
FIG. 1 shows a basic schematic diagram for elucidating one embodiment of the invention.

FIG. 1 firstly shows a basic schematic diagram for elucidating a first embodiment of the invention.

FIG. 1 illustrates a pin 110, which extends in an optical system such as an EUV projection exposure apparatus, for example, in any desired direction and serves for exerting or transmitting a force that is actively controllable (and exerted by an actuator not illustrated in FIG. 1) on(to) a platform 101. The platform 101 carries an optical element (not illustrated), for example a mirror, a lens element or any other optical element desired. In other embodiments, it is also possible to dispense with a platform as intermediate part and to arrange the respective optical element directly in its place. The actuator (not illustrated) can be e.g. a Lorentz actuator, a piezoactuator or any other device for transmitting an actively controllable force.

In the context of the present application, in this case the drive direction of an actuator is defined in each case as the z-direction, whereas the x-y plane runs perpendicular to said drive direction. Consequently, each actuator is respectively assigned its own coordinate system respectively depicted in FIG. 1 ff., wherein the pin 110 runs axially relative to the drive direction of the associated actuator or the z-direction.

The pin 110 has two universal joints 120, 121 in its respective end sections for the purpose of decoupling in a lateral direction, that is to say perpendicular to the drive axis or z-direction (i.e. in the x-y plane). In the exemplary embodiment (without the invention being restricted thereto) each of the universal joints 120, 121 is respectively formed by leaf spring elements offset by 90°, of which only one leaf spring element in each case is indicated in FIG. 1 for reasons of clearer and simpler illustration.

By means of the pin 110 provided with the universal joints 120, 121, when the respective actuator is linked to the relevant optical element, what is achieved is that the sum of the mechanical elements on the one hand in the drive direction has a comparatively high natural frequency, and in contrast has suitable compliances in the remaining degrees of freedom. In other words, the stiffness set for the pin 110 in an axial (drive) direction or z-direction is comparatively high, whereas the pin 110 exhibits extremely soft behaviour in the remaining directions, since the universal joints 120, 121 have only a very low stiffness transversely with respect to the drive direction or z-direction.

In general, the natural frequency f is linked to the stiffness k (in units of N/m) by means of the following relationship:

$$f = \frac{1}{2 \cdot \pi} \sqrt{\frac{k}{m}} \qquad (1)$$

where m designates the mass coupled by means of the pin, which can be designated as a spring to a first approximation. In the case of customary actuator masses of approximately (0.1-1) kg and customary stiffnesses (moduli of elasticity) of the pin (spring constant k) the natural frequency can be approximately 1200 Hz in the z-direction. In this case, excitations whose frequency exceeds 1200 Hz are coupled into the mirror 101 in attenuated fashion ($2^{nd}$ order low-pass filter) in a manner dependent on the square of the reciprocal of the excitation frequency, since the system composed of the actuator and the pin 110 brings about corresponding low-pass filtering. The natural frequencies are in each case to be chosen suitably depending on the specific controller concept.

In order, then, to solve the problem associated with undesirable transverse resonances during operation, as described in the introduction, or to prevent the resonance magnification associated with such transverse resonances from being manifested in the transmission function, the arrangement according to the invention in accordance with FIG. 1 furthermore has a damping element 130. Although said damping element 130 does not eliminate the low natural frequencies in a lateral direction, which are in each case system parameters, it has the effect that amplitude magnification is no longer effected for said transverse resonances.

The damping element 130 is produced from a material which firstly has sufficient damping properties and secondly can be used—for instance in the case of use in a microlithographic projection exposure apparatus—under the vacuum conditions typically provided and with regard to the system contamination to be avoided.

As far as the damping properties are concerned, the damping element, in the direction of the transverse resonances, preferably has a degree of damping D which is at least 1% of the critical damping. The degree of damping can also be significantly higher. In this case, the degree of damping D is understood to be what is called Lehr's damping factor, which, for a damped harmonic oscillator having one degree of freedom is defined as $$D = \frac{d}{2 \cdot \sqrt{k \cdot m}}, \quad (2)$$

where d designates the damping constant, k designates the spring stiffness and m designates the mass.

The critical damping corresponds to that damping for which the oscillator, in the so-called aperiodic limit case, does not oscillate periodically, but rather returns to the rest position in minimal time.

Furthermore, the parameter "tan δ" can be defined for the material of the damping element, said parameter corresponding to the ratio between stiffness and damping and being defined as the ratio between the real part and imaginary part of the complex shear modulus $G=G_1+i^*G_2$, i.e. tan $\delta=G_1/G_2$. Preferred values for tan δ are at least 0.4, preferably at least 0.5, and more preferably at least 0.6.

Suitable materials from which the damping element 130 can be produced are, for the applications in microlithography as envisaged, in particular, in the present case, for example rubbers, e.g. fluoro rubbers (FKM), fluorinated elastomers or perfluoro rubbers (FFKM).

Both in the exemplary embodiment in FIG. 1 and in the further embodiments in FIG. 2 ff., the damping element 130 is in each case embodied or integrated into the arrangement composed of pin 110 and universal joints 120, 121 such that the movements required for actuation are not impeded.

In accordance with FIG. 1, the damping element 130 is embodied as a membrane or disc which is arranged around the pin 110 in a collar-like manner and is fixed to the pin 110 (e.g. by adhesive bonding). In an alternative embodiment (not illustrated), the membrane forming the damping element 130 can also extend through the pin 110.

What is achieved by means of the arrangement of the damping element 130 chosen in FIG. 1 is that the membrane forming the damping element 130 is comparatively compliant in an axial direction and brings about practically no damping, and a significant damping is effected only in a transverse direction (i.e. in the x-y plane). The dimensions of the membrane forming the damping element 130 are in each case to be chosen suitably depending on the stiffnesses to be obtained and depending on the materials used, wherein the dimensions, merely by way of example, can comprise a width in the range of 10-20 mm, a length in the range of 30-50 mm and a thickness of 1-5 mm.

Preferably, the membrane is designed such that the membrane stiffness in an axial direction is less than 20% of the actuator stiffness. Furthermore, the damping element is preferably arranged such that the contribution of the damping element to the torsional stiffness is not more than 50%, more particularly not more than 30%, more particularly not more than 10%, of the torsional stiffness of the universal joint in the pin.

In FIG. 1, the stiffness of the linking of the pin 110 to the "fixed world" is represented by means of a spring and designated by "115". In order to obtain a desired Lehr's damping factor D of the overall system (composed of pin and mass of the pin), the stiffness of the membrane is chosen as follows: for the stiffness $k_g$ of the membrane with respect of transverse movements of the pin the following relationship holds true—to an approximation as explained below—

$$k_g > 2 \cdot D \cdot \frac{k}{\tan\delta} \quad (3)$$

where D designates Lehr's damping factor (which, as explained above, has a preferred value of at least 1% of the critical damping) or the desired damping with respect to transverse vibrations, k designates the stiffness of the pin with respect to transverse movement, and tan δ designates the parameter already mentioned above (as material constant of the chosen material of the damping element) which specifies the loss factor of the used material of the damping element (i.e. of the respective rubber).

The relationship (3) in this case represents a good approximation for the case where the value of the stiffness $k_g$ of the membrane with respect to transverse movements is significantly less than the value of the stiffness k of the pin with respect to transverse movements.

As can be seen from FIG. 1, the membrane forming the damping element 130 is furthermore arranged directly in the vicinity of that universal joint which is situated in that end section of the pin 110 which faces away from the platform 101 (i.e. in accordance with FIG. 1 at the right-hand universal joint 121, which corresponds to the lower universal joint in the case of an arrangement typically effected vertically). In this case, an arrangement in the vicinity of the relevant universal joint 121 should preferably be understood to mean an arrangement in which the distance from the relevant universal joint is less than 5%, more particularly less than 1%, of the total length of the pin 110. In one specific example (without the invention being restricted thereto), given a length of the pin in the range of 5 to 8 cm, e.g. the distance between damping element 130 and universal joint 121 can be e.g. in the range of 1-3 mm. Generally, the membrane forming the damping element 130 can be arranged so near to the universal joint 121 that the membrane can still just be fixed without impairing the joint action of the universal joint 121.

This arrangement of the membrane forming the damping element 130 in that end section of the pin 110 which faces away from the platform 101, or in direct proximity to the universal joint 121 situated there, has the advantage that when the platform 101 or the optical element (e.g. mirror) carried by said platform 101 is intended to be moved in the y-direction relative to the coordinate system depicted in FIG. 1, only very small additional moments or restoring forces from the left-hand (or upper in the case of vertical arrangement) universal joint 120 occur, since the membrane forming the damping element 130 (compared with an arrangement of the membrane in the vicinity of the universal joint 120) is deformed only slightly in the case of a displacement of the platform 101. Instead, it is deformed only to a small extent in the exemplary embodiment on account of the arrangement on the right. By contrast, the damping effect of the membrane forming the damping element 130 is fully manifested in the case of a transverse resonance (as is indicated in FIG. 8*b*), since then, in contrast to a sole movement of the platform 101, deflections substantially parallel to one another take place at both end sections of the pin 110, such that the desired damping effect is achieved by the membrane forming the damping element 130. As a result, what is thus achieved in the arrangement in FIG. 1 is that the damping element 130 permits the "desired" deflections of the platform 101 and respectively of the pin 110 and brings about a damping only for the "undesired" deflections.

A further embodiment of the invention is explained below with reference to FIG. 2*a-c*, wherein substantially functionally identical elements are designated by reference numerals increased by "100" relative to FIG. 1.

Figure 2A:
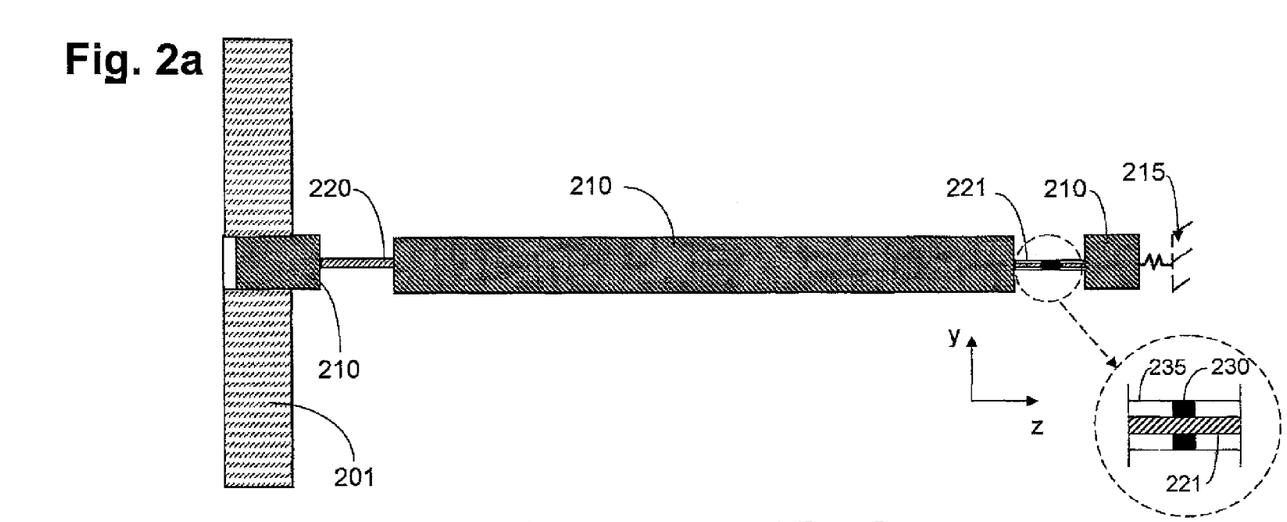
FIGS. 2a-c; 3, 4a-b; 5-6 show schematic illustrations for elucidating further possible embodiments of the invention.

The arrangement in accordance with FIG. 2*a* differs from that from FIG. 1 in that one of the two universal joints, namely the universal joint 221 arranged in that end section of the pin 110 which faces away from the platform 101, has a cutout 221*a*, in which is accommodated the damping element 230 in the form of a plug of preferably cylindrical geometry. FIG. 2*b* shows an illustration without the inserted damping element 230, and FIG. 2*c* shows an illustration with the damping element 230 inserted. In the specific exemplary embodiment in FIG. 2, the cutout 221*a* is realized as a through-hole extending through the universal joint 221, such that said universal joint 221, as can best be seen in FIG. 2*b*, has as it were four leaf spring sections (instead of two leaf springs as in FIG. 1), since each of the leaf springs from FIG. 1 is divided into two. Analogously to FIG. 1 and FIG. 2*a*, FIG. 2*b-c* also illustrate only in each case one of the two leaf spring joints of the universal joint 221, wherein the other is arranged in a manner offset by 90° or in an interleaved manner with respect thereto.

Figure 2B:
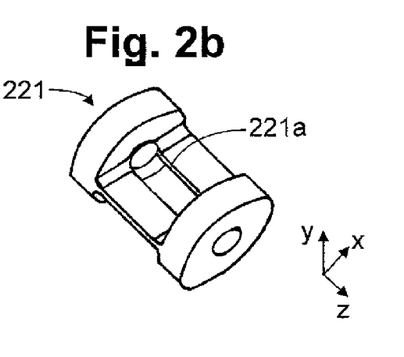
Figure 2C:
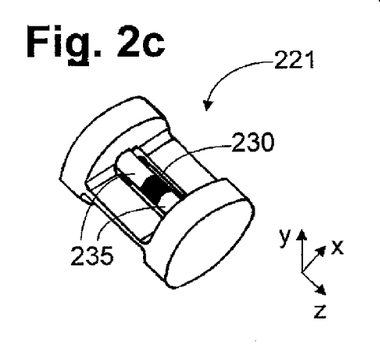

In accordance with FIG. 2*c*, the damping element 230 accommodated in the cutout 221*a* is clamped in by means of appropriate attachment pieces 235, wherein the damping element 230 is preferably arranged centrally on the axis of the pin 210 at the pivot point of the universal joint 221. On account of this central arrangement, once again a rotational movement is only minimally impeded. Furthermore, an axial movement is not impeded either, since the damping element 230 together with the pin 210 is displaced during such an axial movement. Furthermore, the first axial natural vibration form is not impeded either, since, in this respect, the main contribution is provided by the longer remaining pin section. By contrast, the damping effect of the damping element 230 formed by the plug is fully manifested again in the case of the transverse resonance (shown in FIG. 8*b*), since the plug is then subjected to shear stress and a high damping effect accordingly occurs.

As a result, in the arrangement in FIG. 2*a-c*, too, what is thus achieved is that the damping element 230 permits the "desired" movements or deflections of the platform 201 and respectively of the pin 210 and brings about a damping only for the "undesired" deflections or movements.

A further embodiment of the invention is explained below with reference to FIG. 3, wherein substantially functionally identical elements are designated by reference numerals increased by "200" relative to FIG. 1.

Figure 3:
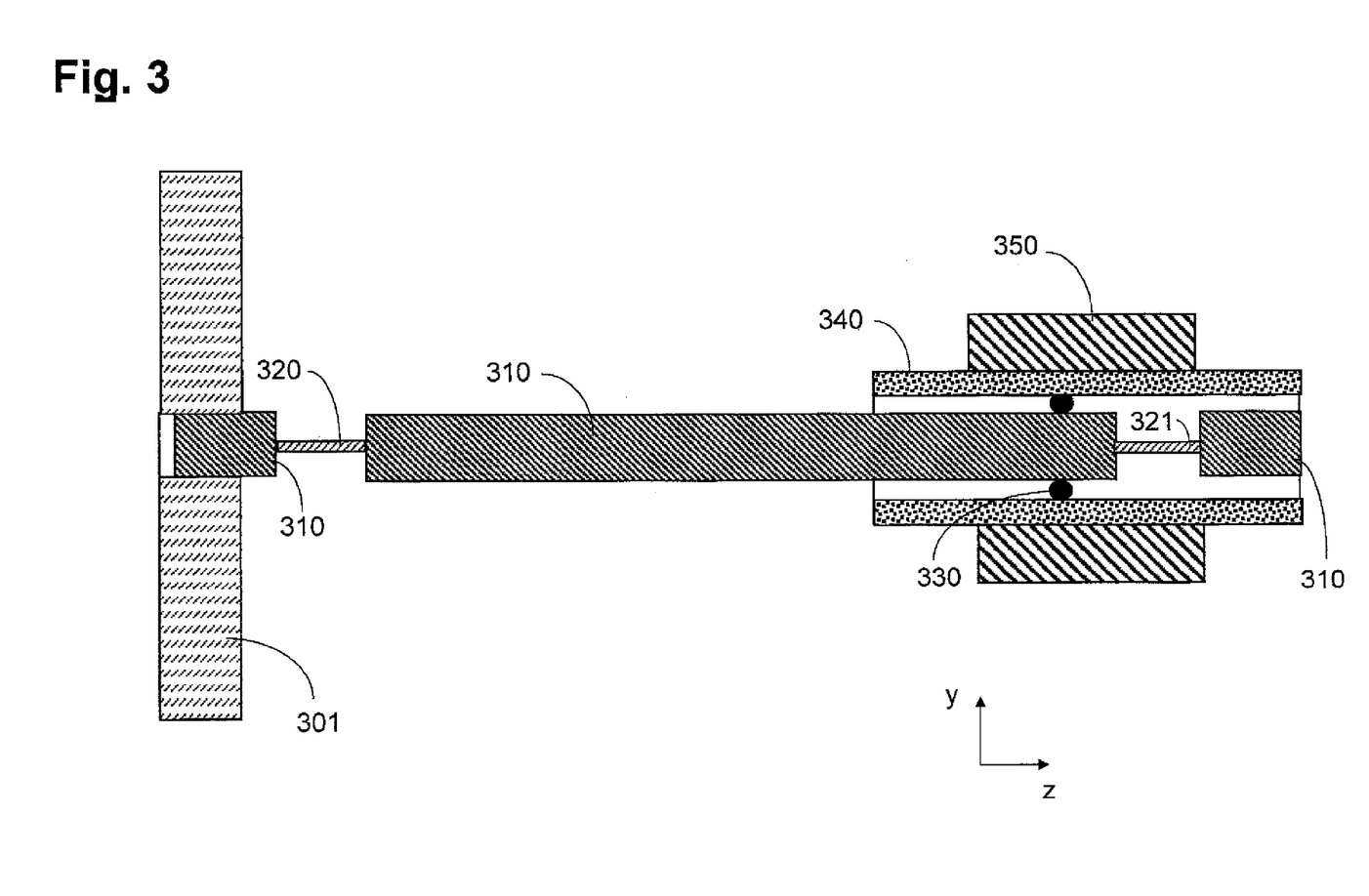

The arrangement in accordance with FIG. 3 differs from those from FIG. 1 and FIG. 2 in that the damping element here is arranged as an (O-)ring on the pin 310, to be precise in a clamping fit between the lateral surface of the pin 310 and a sleeve 340 surrounding the pin 310. Said sleeve can be e.g. a component carrying a motor 350 for the axial drive of the pin 310. Since the sleeve 340 is moved together with the pin 310, no relative movement occurs between sleeve 340 and pin 310 (such that axial compliance of the damping element 330 is no longer required either). For the rest, as in the embodiments described above, when the damping element 330 is arranged in the vicinity of that universal joint 321 which is situated in that end section of the pin 310 which faces away from the platform 301, rotation of the universal joint 320 is not impeded. Furthermore, the first axial natural vibration form is not impeded either, since, in this respect, the main contribution is provided by the longer remaining pin section.

As a result, in the arrangement in FIG. 3, too, what is thus achieved is that the damping element 330 permits the "desired" movements or deflections of the platform 301 and respectively of the pin 310 and brings about a damping only for the "undesired" deflections or movements.

A further embodiment of the invention is explained below with reference to FIG. 4*a-b*, wherein substantially analogous or functionally identical elements are designated by reference numerals increased by "300" relative to FIG. 1.

As in the embodiments described above with reference to FIG. 1-3, FIG. 4*a-b* illustrate only one pin bringing about the mechanical coupling between actuator and optical element, wherein, of course, in the case of actuation of the optical element in six degrees of freedom, it is possible to provide a total of six such pins (e.g. with an arrangement as a hexapod or composed of three bipods).

Figure 4A:
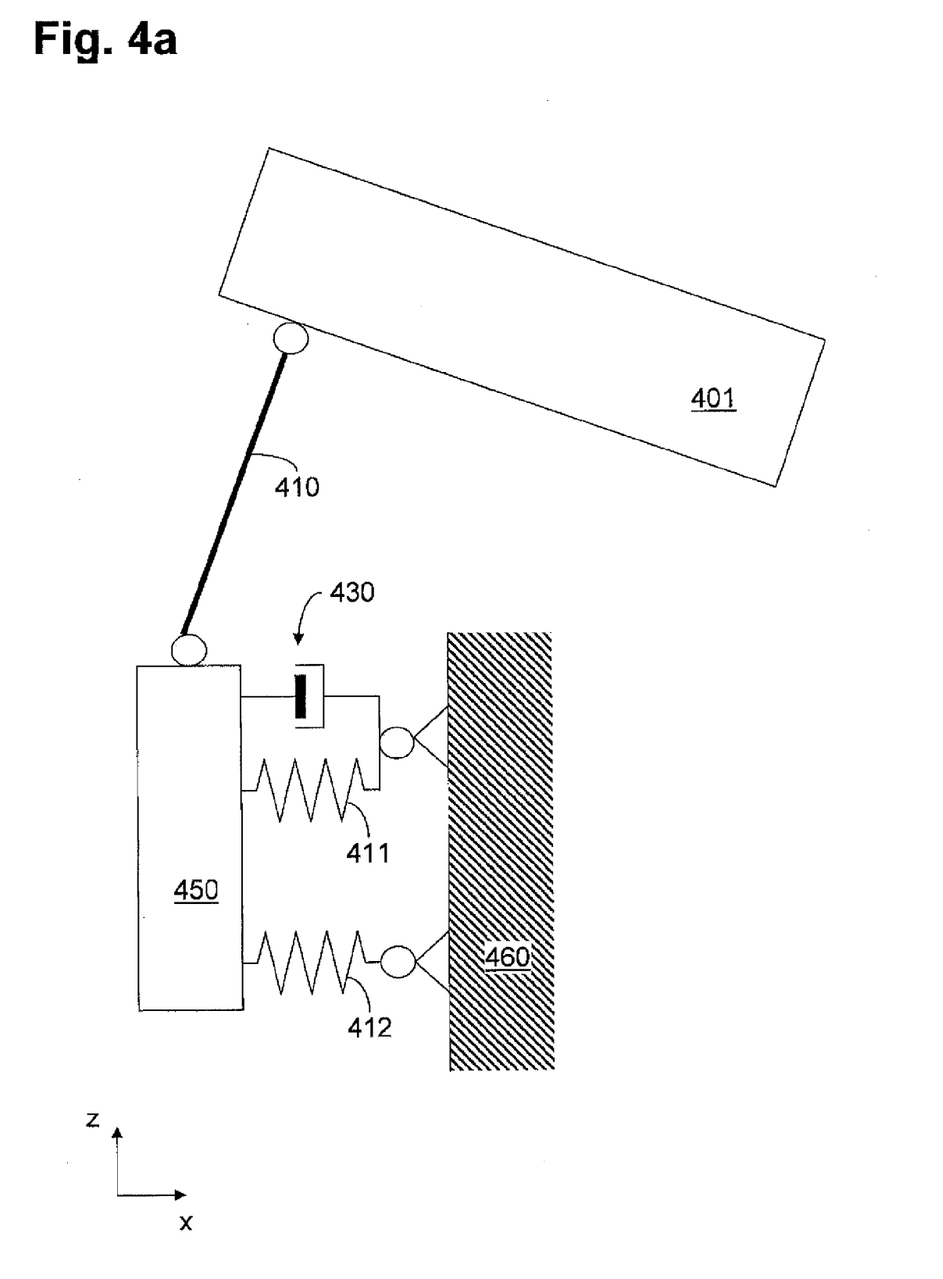
Figure 4B:
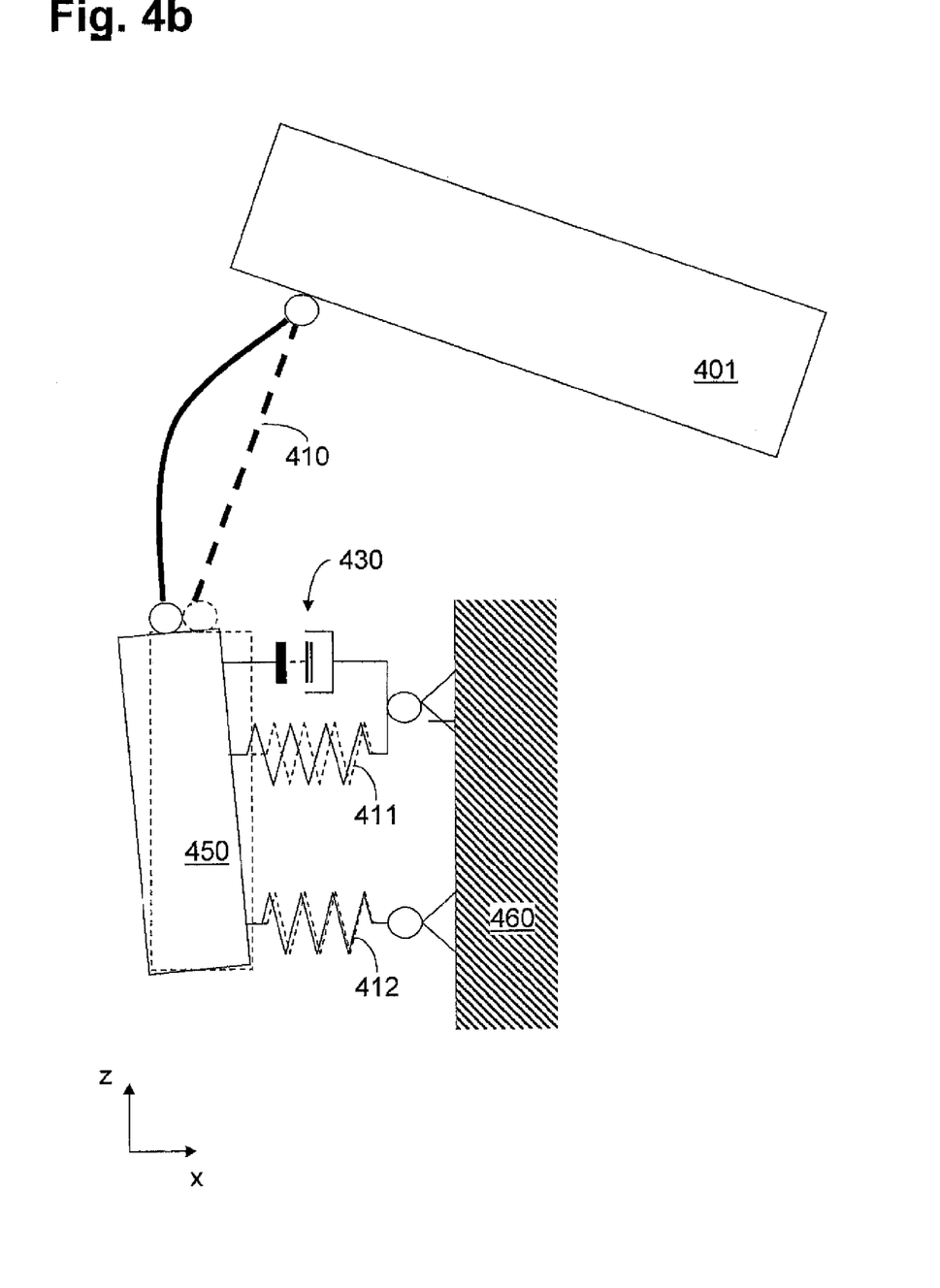

The configuration in accordance with FIG. 4*a-b* differs from those from FIG. 1-3, in particular, in that, in accordance with FIG. 4*a-b*, the damping element 430 is arranged in such a way that it is supported on the actuator 450 by virtue of being arranged between the actuator 450 and the actuator housing 460 (representing the "fixed world") or a stationary structure. FIG. 4*a-b* likewise illustrate guide elements 411, 412 for guiding the actuator in the vertical direction or drive direction (corresponding to the z-direction in the coordinate system depicted). Said guide elements 411, 412 (likewise present in the arrangements in accordance with FIG. 1-3 but not illustrated therein for the sake of simplicity) essentially have the function of obtaining a linear guidance of the actuator 450 that is free with regard to displacement in the z-direction and rotation about the z-axis, and, in the exemplary embodiment, can be configured as a parallel spring system composed of suitably designed leaf springs (which should be differentiated from the leaf springs that can likewise be used e.g. for realizing the universal joints of the pin). The eigenform of an eigenmode of the rod with lateral deflection in the guidance of the actuator is illustrated abstractively in FIG. 4*b*.

As is evident from FIG. 4*a-b*, in accordance with the embodiment described, the mechanical linking of the damping element 430 is effected analogously to the mechanical linking of the guide elements 411, 412, which are likewise arranged between the actuator 450 and the actuator housing 460 representing the "fixed world". In specific terms, the damping element 430 can be incorporated e.g. as a membrane in an arrangement parallel to the leaf springs forming the guide elements 411, 412. However, in this concept, too, the invention is not restricted to a membrane as damping element; any other suitable realizations, including different geometries of the damping element (e.g. also ring-shaped or strip-shaped geometries), are possible. Furthermore, for suitable specific configurations of the damping element 430 with regard to material, dimensioning, damping properties, etc., reference is made to the corresponding explanations in connection with the embodiments described above.

The configuration described with reference to FIG. 4a-b takes account of the circumstance that the guide elements 411, 412 configured e.g. as leaf springs are not infinitely stiff including in the lateral direction (i.e. in a plane perpendicular to the z-direction in the coordinate system depicted), rather, on account of a finite lateral compliance, a movement of the actuator 450 can also take place in the plane perpendicular to the z-direction or in the lateral direction. By virtue of the fact that the mechanical linking of the damping element 430 is effected analogously to the mechanical linking of the guide elements 411, 412, this—albeit slight—undesired lateral movement can now be damped, which in turn advantageously results in a damping of the entire vibration of the pin. In other words, the damping element 430 according to the invention intervenes in a targeted manner in the lateral movement of the pin 410 relative to the drive axis of the actuator, in order to introduce damping into the entire vibration in this way.

Furthermore, what is achieved by the arrangement of the damping element 430 in accordance with FIG. 4a-b is that, despite the stiffness inherent, in principle, to the damping element 430, no additional stiffness is introduced into the universal joints (e.g. likewise realized by leaf springs) of the pin 401, since the damping element 430 is positioned elsewhere. Consequently, rotational movements of said universal joints are not impeded, and the introduction of deformations into the optical element or the coupling-in of disturbing forces and actuator forces is avoided.

Figure 5:
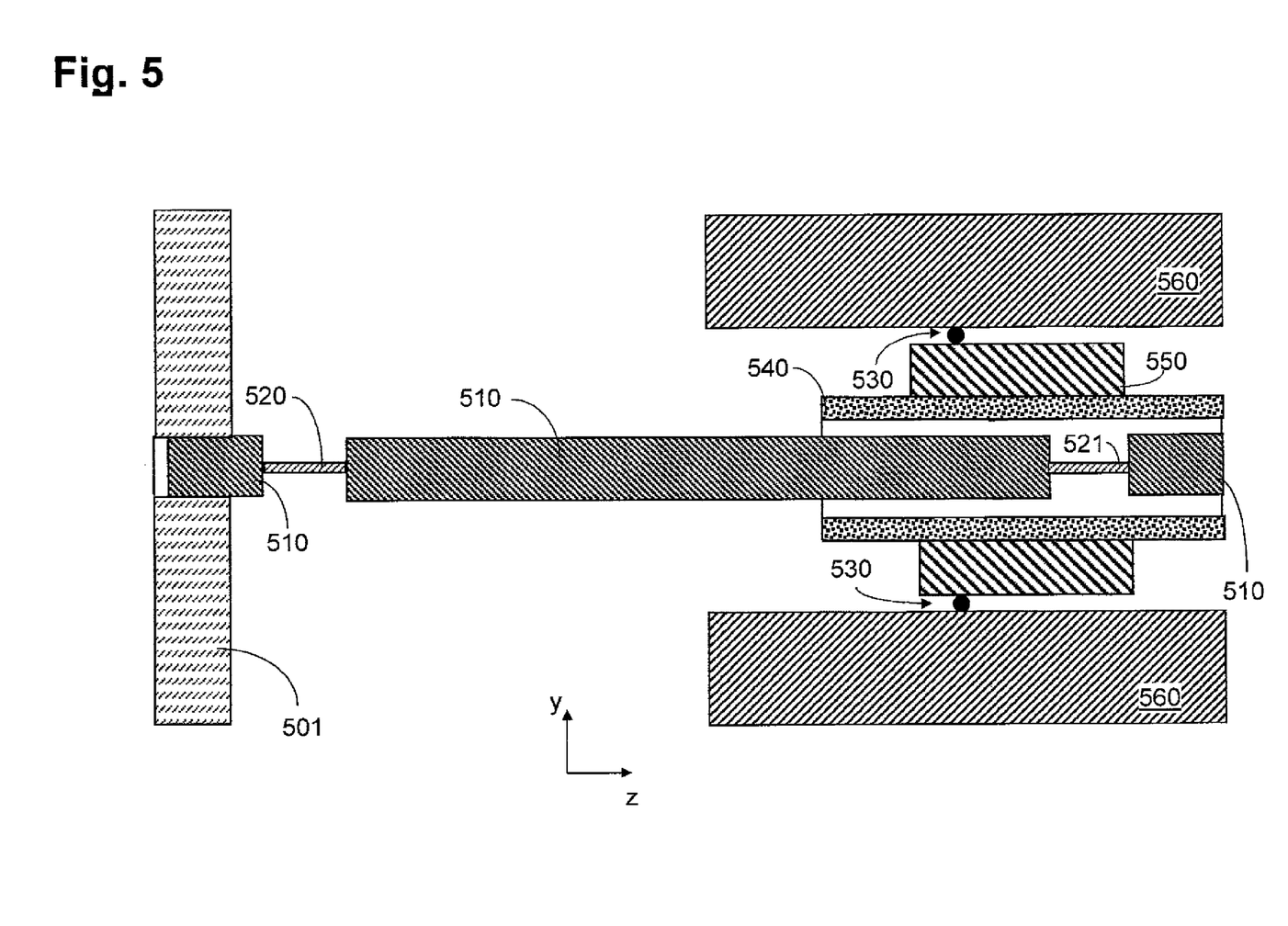

FIG. 5 shows, in a schematic illustration analogous to FIG. 3, one possible realization of the principle described above with reference to FIG. 4a-b, wherein substantially analogous or functionally identical elements are designated by reference numerals increased by "200" relative to FIG. 3. The configuration in accordance with FIG. 5 differs, according to the principle described with reference to FIG. 4a-b, from the configuration from FIG. 3, in particular, in that, in accordance with FIG. 5, the damping element 530 is arranged in such a way that it is supported on the actuator 550 by being arranged between the actuator 550 and the actuator housing 560 (representing the "fixed world") or a stationary structure. In this case, the damping element 530 can be configured for example (and without the invention being restricted thereto) in ring-shaped fashion and/or surround the actuator 550 in a collar-like manner. For suitable specific configurations of the damping element 530 with regard to material, dimensioning, damping properties, etc., reference is once again made to the explanations in connection with the embodiments described above.

A further embodiment of the damping element according to the invention is explained below with reference to the merely schematic illustration in FIG. 6.

Figure 6:
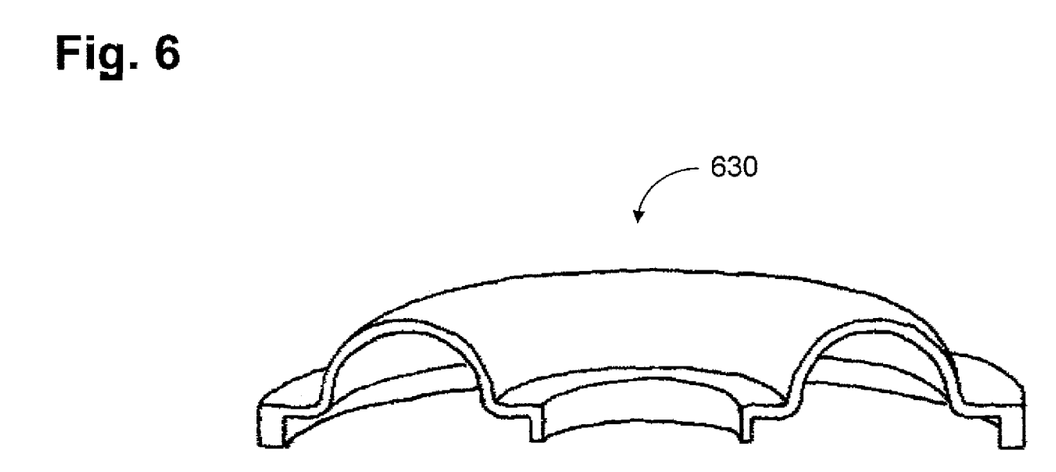

As illustrated in FIG. 6 in perspective view, the damping element 630 here has a ring-shaped geometry with a U-profile (corresponding to a "bead"). On account of this geometry, for the damping element 630 this results, on the one hand, in a comparatively high compliance in an axial direction relative to the drive axis of the actuator, and, on the other hand, in a comparatively high stiffness in a lateral direction relative to the drive axis of the actuator, such that as a result a linear guidance is formed for the actuator in an axial direction relative to the drive axis of the actuator. In this way it is possible, if appropriate, to dispense in particular with additional guide elements for the linear guidance of the actuator along its drive direction, since the function of said guide elements is already performed by the damping element 630 according to the invention. The damping effect can furthermore be achieved by means of the suitable material (in particular the rubber materials which can be used according to the invention for the damping element). A significant simplification of the construction of the arrangement according to the invention is achieved as a result.

Even though the invention has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An arrangement, comprising:
   an optical element;
   an actuator configured to exert a controllable force on the optical element, the actuator having a drive axis;
   a pin configured to be disposed between the actuator and the optical element; and
   a damping element configured to bring about a damping of a natural vibration form of the pin in a lateral direction,
   wherein:
   the pin has a stiffness in an axial direction relative to the drive axis of the actuator;
   the pin has a stiffness in a lateral direction relative to the drive axis of the actuator;
   a ratio of the stiffness of the pin in the axial direction to the stiffness in the lateral direction is at least 100;
   the damping element has a Lehr's damping factor in the axial direction that is not more than 1%; and
   the arrangement is configured to mount the optical element.

2. The arrangement of claim 1, wherein the damping element has a degree of damping that is at least 1% of a critical damping of the natural vibration form.

3. The arrangement of claim 1, wherein the damping element comprises a rubber.

4. The arrangement of claim 3, wherein the rubber comprises a material selected from the group consisting of a fluoro rubber and a fluorinated elastomer.

5. The arrangement of claim 3, wherein the rubber comprises a perfluoro rubber.

6. The arrangement of claim 1, wherein the damping element is arranged on an outer surface of the pin.

7. The arrangement of claim 6, wherein the damping element surrounds the pin in a collar- or ring-shaped fashion.

8. The arrangement of claim 6, wherein the damping element is between the outer surface of the pin and a further component of the arrangement.

9. The arrangement of claim 8, wherein the further component comprises a sleeve surrounding the pin.

10. The arrangement of claim 1, wherein the damping element is configured so that the damping element is supported on the actuator.

11. The arrangement of claim 1, wherein the damping element is between the actuator and a stationary structure.

12. The arrangement of claim 11, wherein the stationary structure comprises an actuator housing.

13. The arrangement of claim 1, wherein the damping element is configured so that the damping element brings about a damping of a lateral movement of the actuator relative to the drive axis of the actuator.

14. The arrangement of claim 1, wherein the damping element is a guide for the actuator in the axial direction.

15. The arrangement of claim 1, wherein the damping element has a structure which increases the stiffness in a lateral direction.

16. The arrangement of claim 15, wherein the structure comprises a bead.

17. The arrangement of claim 1, wherein the damping element is a membrane.

18. The arrangement of claim 1, wherein the pin comprises at least two universal joints.

19. The arrangement of claim 18, wherein the pin has a total length, and the damping element is a distance from one of the universal joints which is less than 5% of the total length of the pin.

20. The arrangement of claim 18, wherein at least one of the universal joints has a cutout, and the damping element is in the cutout.

21. The arrangement of claim 20, wherein the cutout is a through-hole extending through the at least one universal joint.

22. The arrangement of claim 1, further comprising the optical element.

23. The arrangement of claim 22, wherein the optical element is a mirror.

24. An apparatus, comprising:
   an arrangement, comprising:
      an optical element;
      at least one actuator configured to exert a controllable force on the optical element
      a pin between the actuator and the optical element; and
      a damping element configured to bring about a damping of a natural vibration form of the pin in a lateral direction,
   wherein:
      the pin has a stiffness in an axial direction relative to the drive axis of the actuator;
      the pin has a stiffness in a lateral direction relative to the drive axis of the actuator;
      a ratio of the stiffness of the pin in the axial direction to the stiffness in the lateral direction is at least 100;
      the damping element has a Lehr's damping factor in the axial direction that is not more than 1%;
      the arrangement is configured to mount an optical element; and
   the apparatus is an EUV projection exposure apparatus.

25. An arrangement, comprising:
   an actuator configured to exert a controllable force on the optical element;
   a pin configured to be positioned between the actuator and the optical element; and
   a damping element configured to bring about a damping of a natural vibration form of the pin in a lateral direction,
   wherein:
      the pin has a stiffness in an axial direction relative to the drive axis of the actuator;
      the pin has a stiffness in a lateral direction relative to the drive axis of the actuator;
      a ratio of the stiffness of the pin in the axial direction to the stiffness in the lateral direction is at least 100;
      the damping element has a Lehr's damping factor in the axial direction that is not more than 1%;
      the pin bears at least a part of the weight of the optical element; and
      the arrangement is configured to mount the optical element.

* * * * *